United States Patent [19]

Priel et al.

[11] 3,962,589
[45] June 8, 1976

[54] INVERTER WITH MINIMUM SKEW
[75] Inventors: Ury Priel, Cupertino, Calif.; Robert A. Anselmo, Canastota, N.Y.
[73] Assignee: National Semiconductor Corporation, Santa Clara, Calif.
[22] Filed: Feb. 10, 1975
[21] Appl. No.: 548,189

[52] U.S. Cl. ............................ 307/214; 307/262; 307/DIG. 1
[51] Int. Cl.² ...................................... H03K 19/40
[58] Field of Search .......... 307/213, 214, 215, 218, 307/262, 261

[56]          References Cited
         UNITED STATES PATENTS
3,229,119   1/1966   Bohn et al. ................... 307/214 X

*Primary Examiner*—John Zazworsky
*Attorney, Agent, or Firm*—Lowhurst & Aine

[57]          ABSTRACT

A dual inverter circuit wherein the first inverter circuit includes a pair of phase splitter transistors, one serving to feed the base of the pull-up transistor in the first inverter circuit and the other serving to feed the base of the phase splitter transistor in the second inverter circuit. The circuit provides a minimum delay time between the operation of the first inverter and the turn-on time of the second inverter while also providing active pull-up circuits, i.e., pull-up transistors, in the two inverters to insure fast operate times for both inverters especially desirable when feeding into large capacitance loads.

2 Claims, 3 Drawing Figures

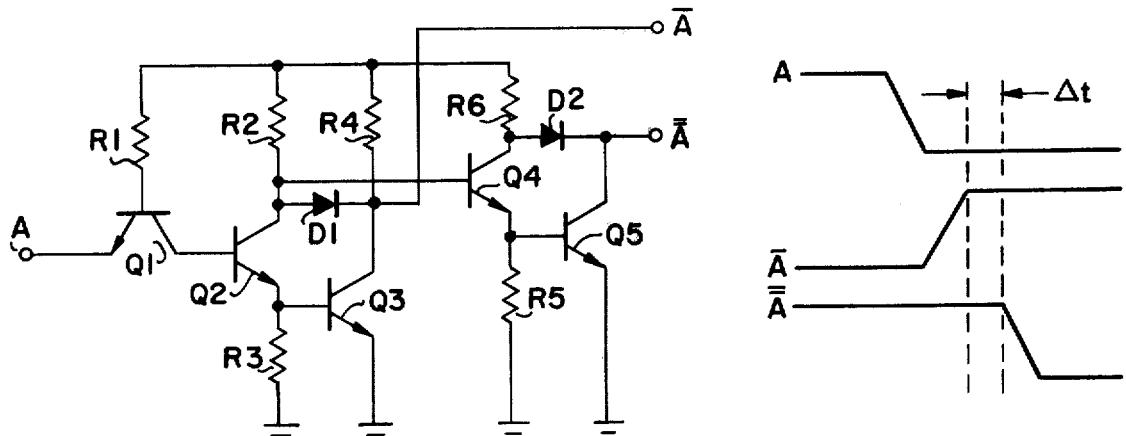
Fig_1
PRIOR ART
Fig_2
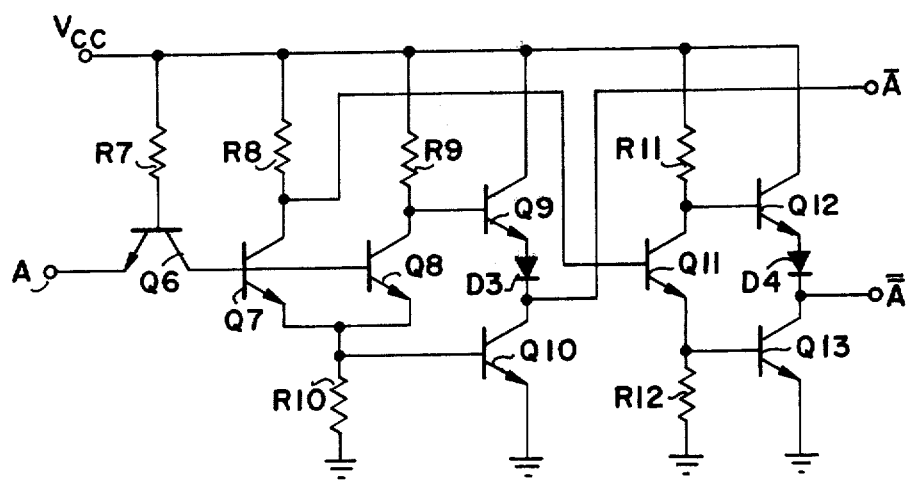
Fig_3

INVERTER WITH MINIMUM SKEW

BACKGROUND OF THE INVENTION

Many integrated circuits employ decoders, for example memories in which one address location is selected out of many based upon an input code. In order to implement such decoders it is necessary to provide an incoming signal A of one state and its complementary signal $\bar{A}$ of another state. Signals A and $\bar{A}$ may be generated externally of the integrated circuit and then brought into the decoder. However, this requires a large number of PINS and is very cumbersome.

A second method is to bring signal A into the package and then generate the complement $\bar{A}$ within the package by adding an inverter. This results in numerous fanning at the input loading of the package.

The preferred method is to bring the signal A into the package and then to double invert it with two inverters within the package, thus obtaining $\bar{A}$ from a first inverter and $\bar{\bar{A}}$, the complement of $\bar{A}$ and the equivalent of A, from a second inverter fed from the first inverter. This results in a large internal fan-in but the circuit packages are easily designed to handle this large internal fan-in. With such a dual inverter circuit it is desirable that, upon the input of the signal A, both internal inverters operate simultaneously to produce output signals $\bar{A}$ and $\bar{\bar{A}}$ at the same instant in time. However, the series arrangement of the two inverters is such that the first inverter operates first in time to produce signal $\bar{A}$, and the second inverter then responds to the operation of the first inverter to produce the complementary signal $\bar{\bar{A}}$. Since there is a slight delay between the response of the first inverter and that of the second inverter, there is a short period of time in which the outputs of the two inverters are in the same state rather than being complementary. When this delay is long enough, the decoder will react to the two similar states on the two inverter outputs to produce an undesired error in the state of one or more of the decoder outputs.

It has been suggested how the undesired delay time between operation of the first inverter and turn-on of the second inverter may be shortened by the circuit shown in FIG. 1 hereof and first disclosed in an article entitled, "Beware the Glitch" by Ury Priel on pages 43 and 44 of the section Design/Functions/Digital in EDN of Apr. 1, 1971.

In this circuit, the first inverter comprises input transistor Q1 and input resistor R1, phase splitter transistor Q2 and phase splitter resistor R2, turn off resistor R3, and the output stage comprising diode D1, pull down transistor Q3 and pull up resistor R4. The second inverter circuit comprises the phase splitter transistor Q4, turn off resistor R5, and the output stage including pull up resistor R6, diode D2, and pull down transistor Q5. In a more conventional dual inverter circuit, the drive for the base of phase splitter transistor Q4 would be obtained via another transistor Q6 from the collector of pull down transistor Q3. The output for $\bar{A}$, and the turn on time of the second inverter would be delayed so that output $\bar{\bar{A}}$ would be high along with output $\bar{A}$ for this delay time period $\Delta t$ FIG. 2. In the circuit of FIG. 1, the drive for phase splitter transistor Q4 is taken at an earlier stage, i.e., at the collector of phase splitter transistor Q2, and the delay in turn-on time for the second inverter is substantially shortened. A primary drawback to the circuit of FIG. 1 is that the outputs $\bar{A}$ and $\bar{\bar{A}}$ have resistive pull-ups, i.e., resistors R4 and R6, which reduce the speed of operation of the inverters when operating into a capacitive load; this is very undesirable in high speed circuits such as PROMs (Programmable Read Only Memories).

SUMMARY OF THE PRESENT INVENTION

The present invention comprises a dual inverter circuit which provides a minimum delay time between the operation of the first inverter and the turn-on time of the second inverter while also providing active pull up circuits, i.e., pull up transistors, in the two inverters to insure fast operate times for both inverters especially desirable when feeding into large capacitance loads. The first inverter circuit includes a pair of phase splitter transistors, one serving to feed the base of the pull-up transistor in the first inverter circuit and the other serving to feed the base of the phase splitter transistor in the second inverter circuit.

BRIEF DESCRIPTION OF THE DRAWINGS

FIG. 1 is a schematic diagram of prior art forms of dual inverter circuit utilizing passive pull-ups in the two inverter circuits.

FIG. 2 are traces illustrating the delay time between dual inverters in prior type circuits.

FIG. 3 is a schematic diagram of a preferred embodiment of the present invention where the two inverters in a dual inverter circuit utilize active pull-up circuits therein.

DESCRIPTION OF THE PREFERRED EMBODIMENTS

The circuit shown in FIG. 1 has been suggested as a solution to the delay occurring in the prior art dual inverter circuits wherein the turn-on signal for the second inverter is obtained from the output mode of the first inverter. In this proposed circuit of FIG. 1, the first inverter comprises the input transistor Q1 and input resistor R1, the phase splitting circuit including phase splitter transistor Q2 and resistor R2, and turn off resistor R3, and the output circuit including diode D1, pull-down transistor Q3, and pull-up resistor R4. The second inverter circuit comprises phase splitter transistor Q4, turn off resistor R5, pull-up resistor R6, diode D2, and pull-down transistor Q5.

In prior circuits the input to the second inverter circuit was taken from the collector of the pull-down transistor Q3, i.e., the output terminal for $\bar{A}$, and via an input transistor to the base of the phase splitter transistor Q4. This produced the delay time $\Delta t$ shown in FIG. 2 between the transition of the output $\bar{A}$ of the first inverter and the transition of the output $\bar{\bar{A}}$ of the second inverter. Thus both $\bar{A}$ and $\bar{\bar{A}}$ are high for the time $\Delta t$ and produced errors in the output.

In the proposed circuit of FIG. 1, the drive to the base of the phase splitter transistor Q4 in the second inverter is taken from the collector of the phase splitter transistor Q2 in the first inverter, and, with a relatively large value resistor R4 to slow down the transition of the $\bar{A}$ output, the delay time $\Delta t$ is eliminated or greatly reduced so that the probability of error in the output is greatly reduced.

In the operation of the circuit of FIG. 1, as input A falls, input transistor Q1 turns on and discharges the base of phase splitter transistor Q2. The collector of transistors Q2 and Q3 rise, being pulled up toward Vcc by the resistor R2 and R4, respectively, and thus the output $\bar{A}$ rises. As the collector of Q2 rises it turns on the phase splitter transistor Q4 which in turn turns on transistor Q5 causing output $\bar{\bar{A}}$ to fall.

The drawback with the proposed circuit of FIG. 1 is that, due to the use of passive pull up components comprising resistors R4 and R6, the speed of operation of the dual inverter circuit is limited, especially when operating into a capacitive load. Such a circuit has proven to be inferior when used in high speed integrated circuits such as PROMs.

A novel circuit that minimizes the undesired delay time $\Delta t$ between the transitions on outputs $\bar{A}$ and $\bar{\bar{A}}$ and also operates with high speed is disclosed in FIG. 3. This dual inverter circuit comprises a first inverter circuit including input transistor Q6 and input resistor R7, a first phase splitter transistor Q7 and resistor R8, a second phase splitter transistor Q8 and resistor R9 in parallel with the first phase splitter circuit, a turn off resistor R10, and an output stage comprising pull up transistor Q9, diode D3, and pull down transistor Q10. The second inverter circuit comprises a phase splitter transistor Q11 and resistor R11, a turn off resistor R12, and an output stage including pull up transistor Q12, diode D4, and pull down transistor Q13.

It is noted that the pull up resistors in the output stages of the two inverter circuits of FIG. 1 have been replaced by the active pull up circuits comprising transistors Q9 and Q12. The utilization of active pull up circuits in the output stages of both the first and second inverter circuits is made possible by the provision of two phase splitter circuits comprising transistors Q7 and Q8 in the first inverter.

In operation, as input signal A falls, input transistor Q6 turns on and discharges the bases of both phase splitter transistors Q7 and Q8. The collector of transistor Q8 rises toward Vcc, turning pull up transistor Q9 on and causing the output $\bar{A}$ to rise toward Vcc. The collector of transistor Q7 also rises toward Vcc, turning the phase splitter transistor Q11 in the second inverter circuit on. Pull up transistor Q12 is turned off and pull down transistor Q13 is turned on, pulling the output $\bar{\bar{A}}$ down toward ground.

The delay time $\Delta t$ between the rise of $\bar{A}$ and the fall of $\bar{\bar{A}}$ is minimized, and the use of the active pull up transistors in the inverter output stages provide substantially increased operating speeds for the two inverters.

With input transistor Q6 driving both transistors Q7 and Q8, it might appear that the circuit would run into the problem of current robbing, i.e., the unequal sharing of base current by the two transistors Q7 and Q8. However, in use, these transistors are overdriven into saturation when turned on so no such problem is encountered.

What is claimed is:

1. A two-inverter circuit comprising:
   a source of voltage for said inverters,
   a first inverter having an input terminal and an output terminal and including:
      a pull up transistor,
      a diode, and
      a pull down transistor all coupled in a series circuit to said voltage source, the collector of said pull down transistor being coupled to said output terminal,
      a pair of phase splitter transistors coupled in a parallel circuit to said voltage source, the emitters of said phase splitter transistors being coupled together and being coupled to the base of said pull down transistor, the collector of a first one of said phase splitter transistors being coupled to the base of said pull up transistor,
      and an input transistor coupled between said input terminal and the bases of said two phase splitter transistors, and
   a second inverter including:
      a pull up transistor,
      a diode, and
      a pull down transistor all coupled in a series circuit to said voltage source, the collector of said pull down transistor being coupled to an output terminal of said second inverter,
      and a phase splitter transistor coupled to said voltage source, the collector and emitter of said phase splitter being coupled to the bases of said pull up and pull down transistors, respectively, the base of said phase splitter transistor being coupled to the collector of a second one of said phase splitter transistors in said first inverter.

2. A circuit comprising a pair of inverters,
   a first input terminal coupled to the input of a first inverter, first output terminal coupled to the output of said first inverter,
   an input to a second inverter,
   an output terminal coupled to the output of said second inverter,
   a source of voltage for said inverters comprising a first voltage terminal and a second voltage terminal,
   said first inverter comprising first, second, third, fourth, and fifth transistors each having a collector, emitter, and base,
   the emitter of said first transistor being coupled to said first input terminal, and
   the collector of said first transistor being coupled to the bases of said second and third transistors,
   a first impedance element coupling the base of said first transistor to said first voltage terminal,
   a second impedance element coupling the collector of said second transistor to said first voltage terminal,
   a third impedance element coupling the emitters of said second and third transistors to said second voltage terminal,
   a fourth impedance element coupling the collector of said third transistor to said first voltage terminal,
   the base of said fourth transistor being coupled to the collector of said third transistor,
   the collector of said fourth transistor being coupled to said first voltage terminal,
   a diode coupling the emitter of said fourth transistor to the collector of said fifth transistor,
   the base of said fifth transistor being coupled to the emitter of said second and third transistors,
   the emitter of said fifth transistor being coupled to said second voltage terminal,
   said second inverter comprising sixth, seventh and eighth transistors each having a collector, emitter, and base,
   the base of said sixth transistor serving as said input to said second inverter and being coupled to the collector of said second transistor,
   a fifth impedance element coupling the collector of said fifth transistor to said first voltage terminal, a sixth impedance element coupling the emitter of said sixth transistor to said second voltage terminal,
the collector of said seventh transistor being coupled to said first voltage terminal,
the base of said seventh transistor being coupled to the collector of said sixth transistor,
a second diode coupling the emitter of said seventh transistor to the collector of said eighth transistor,
the base of said eighth transistor being coupled to the emitter of said sixth transistor, and
the emitter of said eighth transistor being coupled to said second voltage terminal.

* * * * *